(12) United States Patent
Kim

(10) Patent No.: US 7,929,360 B2
(45) Date of Patent: Apr. 19, 2011

(54) FLASH MEMORY WITH TWO-STAGE SENSING SCHEME

(76) Inventor: Juhan Kim, San Jose, CA (US)

( * ) Notice: Subject to any disclaimer, the term of this patent is extended or adjusted under 35 U.S.C. 154(b) by 0 days.

(21) Appl. No.: 12/748,081

(22) Filed: Mar. 26, 2010

(65) Prior Publication Data

US 2010/0182846 A1 Jul. 22, 2010

Related U.S. Application Data

(63) Continuation of application No. 12/488,554, filed on Jun. 20, 2009, now Pat. No. 7,688,629, which is a continuation of application No. 12/202,843, filed on Sep. 2, 2008, now Pat. No. 7,688,648.

(51) Int. Cl.
*G11C 7/00* (2006.01)

(52) U.S. Cl. ......... 365/189.14; 365/189.05; 365/189.06; 365/210

(58) Field of Classification Search ............ 365/189.14, 365/189.05, 189.06, 210
See application file for complete search history.

(56) References Cited

U.S. PATENT DOCUMENTS

| | | | |
|---|---|---|---|
| 5,465,235 A | 11/1995 | Miyamoto | |
| 5,973,957 A | 10/1999 | Tedrow | |
| 5,978,264 A | 11/1999 | Onakado et al. | |
| 6,480,419 B2 | 11/2002 | Lee | |
| 6,621,744 B2 * | 9/2003 | Kojima | 365/185.23 |
| 7,339,845 B2 * | 3/2008 | Blasi et al. | 365/203 |

OTHER PUBLICATIONS

"A 3.3V 32Mb NAND Flash Memory with Incremental Step Pulse Programming Scheme", IEEE Journal of Solid-State Circuits, vol. 30, No. 11, pp. 1149-1156, Nov. 1996.
"A Negative Vth Cell Architecture for Highly Scalable, Excellently Noise-Immune, and Highly Reliable NAND . . . ", IEEE Journal of Solid-State Circuits, vol. 34, No. 5, Nov. 1999.
"A Channel-Erasing 1.8-V-Only 32-Mb NOR Flash EEPROM with a Bitline Direct . . . ", IEEE Journal of Solid-State Circuits, vol. 30, No. 11 Nov. 2000.

* cited by examiner

*Primary Examiner* — Son T Dinh

(57) ABSTRACT

For the flash memory, two-stage sensing scheme is realized such that a tiny local sense amp is devised in order to insert between memory cells, which minimizes area penalty, wherein the local sense amp is connected to a global sense amp through a global bit line for configuring two-stage sensing scheme. By inserting as many as local sense amps, long bit line is multi-divided into short bit lines. By the sensing scheme, cell current difference is converted to time difference when reading data. With the short bit line architecture, bit line capacitance is significantly reduced, so that low current memory cell can be used for storing data, and which cell may reduce programming time as well. Furthermore, the memory cell can be formed from thin-film transistor even though the thin-film transistor can flow lower current, which realizes multi-stacked memory cells. Additionally, alternative circuits and memory cell structures are described.

16 Claims, 9 Drawing Sheets

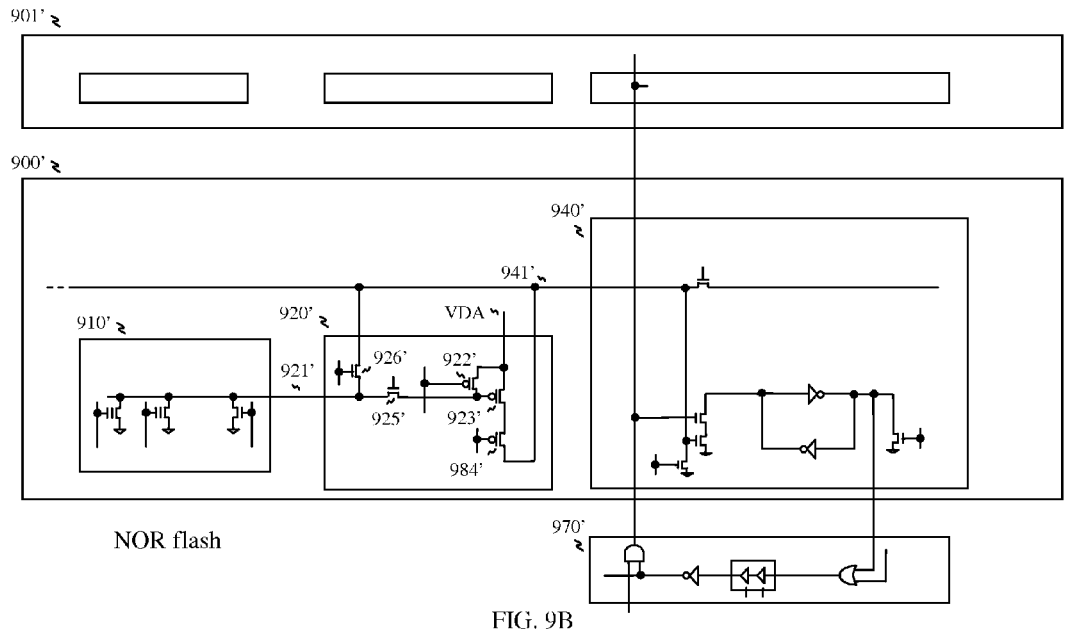
FIG. 9B
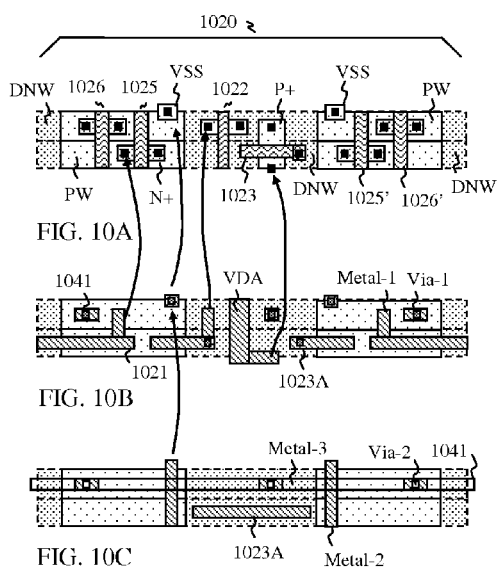
FIG. 10A
FIG. 10B
FIG. 10C
FIG. 10D

NOR flash

FLASH MEMORY WITH TWO-STAGE SENSING SCHEME

CROSS REFERENCE TO RELATED APPLICATION

The present invention is a continuation of application Ser. No. 12/202,843, filed on Sep. 2 2008, and application Ser. No. 12/488,554, filed on Jun. 20 2009, which are herein incorporated by reference.

FIELD OF THE INVENTION

The present invention relates generally to integrated circuits, in particular to high speed flash memory with light bit line architecture, such as, NAND flash memory and NOR flash memory.

BACKGROUND OF THE INVENTION

Flash memory device includes charges, wherein charges are stored in an isolated conductor, commonly referred to as a floating gate, in an FET (field-effect transistor) device. A memory cell (cell transistor) operates by storing electric charge (representing either a binary "0" or "1" state of one data bit) on the floating gate, which is incorporated into a MOS (Metal-Oxide Semiconductor) field-effect transistor. The stored charges affect the VT (threshold voltage) of the transistor, thereby providing a way to read the current through the storage device.

A memory cell typically consists of a transistor, a floating gate, and a control gate above the floating gate in a stacked gate structure. The floating gate, typically composed of polycrystalline silicon (i.e., "polysilicon"), is electrically isolated from the underlying semiconductor substrate by a thin dielectric layer, which is typically formed of an insulating oxide, and more particularly, silicon oxide. This dielectric layer is often referred to as a tunnel oxide layer. The control gate is positioned above the floating gate, and is electrically isolated from the floating gate by a storage dielectric layer. Thus, the floating gate serves as a charge trap region, wherein charges are stored in the charge trap region. Other charge storage devices are constructed to store charges in insulator bulk traps in the FET device, such as MNOS (metal-nitride-oxide-semiconductor), MAOS (metal-alumina-oxide-semiconductor), MAS (metal-alumina-semiconductor), and SONOS (silicon-oxide-nitride-oxide-semiconductor) memory cells.

A programmed memory cell has its VT increased by increasing the amount of negative charge stored on the floating gate, i.e., for given source and drain voltages, the control gate voltage which allows a current to flow between the source and the drain of a programmed memory cell is higher than that of a non-programmed memory cell. Therefore, the state of a memory cell is read by applying a control gate voltage below a predetermined level corresponding to the programmed state, but sufficiently high to allow a current between the source and the drain in a non-programmed memory cell. If a current is detected, then the memory cell is read to be not programmed.

The floating gate memory, such as flash memory, can configure very high density memory. Then, the flash memory is applied to cell phone, music player, movie player, the memory of the image in the digital camera, substitution of the hard disk drive, and so on.

The conventional flash memory is realized by using sense amp in order to measure the current of the floating gate transistor. In FIG. 1A, one of prior arts for the sense amp is illustrated, as published, "A 3.3V 32 Mb NAND Flash Memory with Incremental Step Pulse Programming Scheme", IEEE Journal of Solid-State Circuits, Vol. 30, No. 11, pp 1149-1156, November 1996, and U.S. Pat. No. 6,480,419 and U.S. Pat. No. 5,790,458. Before read, pre-charge transistor 121 is turned on to set a sensing node 120 to high, and another pre-charge transistor 138 resets a latch circuit 130 including a clocked inverter 132 and an inverter 134. In order to read, pre-charge signal PRE is de-activated to high, enable signal PBENB is also de-activated to high, and latch signal LATCH is low, while select signal SLT is activated to high. Then, page selection transistors 122e and 122o connect either an even bit line BLe or an odd bit line BLo to the sensing node 120 for an access. The selected memory cell (not shown) discharges latch node 131 through transfer transistor 126, when low threshold data is stored in the selected memory cell. Otherwise the memory cell does not discharge the latch node 131, thus the latch keeps high. After then, the latched data is transferred to DATA LINE by Y access transistor 140.

In FIG. 1B, another circuit shows the structure of the essential portion of a NAND flash memory device, as a prior art which is published as "A Negative Vth Cell Architecture for Highly Scalable, Excellently Noise-Immune, and Highly Reliable NAND Memories", IEEE Journal of Solid-State Circuits, Vol. 34, No. 5, pp 675-684, November 1999, and U.S. Pat. No. 6,049,494. Namely a sensing circuit that is concerned with data writing and reading. For the sake of diagrammatic simplification, FIG. 1B shows each unit consisting of a plurality of NAND memory cells whose drains are commonly connected to a bit line. More specifically, each unit comprises a flip-flop circuit 151 and 152 for temporarily holding a data, a bit line BL, NAND memory cells M1 and M32, N-channel transistor Q1 for pre-charging the bit line BL to a predetermined potential, N channel transistor Q2 for connecting the bit line BL to the flip-flop circuit, and N-channel transistor Q3 having both ends connected between a node of the flip-flop circuit on the opposite side to the bit line BL and a bit line side end of the transistor Q2. This transistor Q3 is provided to hold read data and then output a potential corresponding to inverted data of the read data to the bit line BL. The individual terminals of the flip-flop circuit are connected to an I/O line and a BI/O line via a column gate 154 and 155, respectively. The control signals phi.1, phi.2 and phi.3 are generated by sequential control circuit (not shown) for driving operation modes. A phi.1 signal line is connected to the gate of the transistor Q1 to control the pre-charging. A phi.2 signal line and a phi.3 signal line are respectively connected to the gate of the transistor Q2 and the gate of the transistor Q3, and are controlled at predetermined timings. The source of the transistor Q1 is connected to a power supply which provides a high supply voltage (for example, 9V) in write mode and a low supply voltage (for example, 5V) otherwise. The power supply for the flip-flop circuit 151 and 152 is provided as the same manner.

A description will now be given of the operation of copying data of a memory cell (for example, M1). It is assumed that the copying destination cell (for example, M1) has been erased previously, i.e., it has been set ON previously. First, data of the cell (for example, M1) is read out. At this time, the individual transistors of the flip-flop circuit (151 and 152) which receive clocks (not shown) are cut off and are disabled. The transistor Q2 connected to the bit line BL is set off and the transistor Q3 is also set off. Suppose that the bit line BL is pre-charged to a high level and the transistor Q2 is turned on to set the bit line BL in a free running state. After a proper time elapses, the flip-flop circuit (151 and 152) is enabled. When the potential of the bit line BL then is higher than the threshold value voltage of the flip-flop circuit, i.e., when data is written in the cell M1 and the threshold value is high, a node 153 between the bit line BL and the flip-flop circuit is set to a high level. If the cell M1 is left erased, the bit line BL is discharged so that the node 153 is set to a low level. This completes the reading operation. That is, the read data in the cell M1 is latched in the flip-flop circuit.

The conventional flash memory has progressed its miniaturization and as a result there arises difficulties in obtaining necessary current to measure the stored data in the memory cell. The turn-on current of the memory cell should drive the selected bit line because the bit line is relatively heavy and long to connect multiple memory cells. And as shown in the prior arts, the latch circuit including two clocked inverters and switches is controlled by timing generator circuit (not shown) wherein the timing is generated by delay circuits typically. This means that the memory cell should discharge the heavy bit line within the predetermined time. And the ratio between the turn-on current and the turn-off current should be relatively high to differentiate low threshold data and high threshold data, such as several 1000 times different. When the ratio is very low, the leakage current (turn-off current) may also discharge the bit line, which may cause the sensing error because the latch node is discharged whether the threshold voltage of the memory cell is low or high. And also the timing generation for controlling the latch is more difficult because there is no precise timing generator based on the turn-on current.

Furthermore, one of major problem is that the turn-on current through the floating gate MOS transistor is low, around 1 uA or less for the conventional flash memory, as published, "A 90-nm CMOS 1.8-V 2-Gb NAND Flash Memory for Mass Storage Applications", IEEE Journal of Solid-State Circuits. Vol. 38, No. 11, November, 2003. Even worse in the other types of floating gate memory, such as the nanocrystal memory, the drain current of the memory cell is around 1 nA or less, as published, "Metal Nanocrystal Memories—Part II: Electrical Characteristics", IEEE Transactions on Electron Devices, Vol. 49, No. 9, September, 2002. And for the single electron memory (SEM) including quantum dot, the drain current is 1.5 p~3 pA as published, "Room temperature Coulomb oscillation and memory effect for single electron memory made by pulse-mode AFM nano-oxidation process", 0-7803-4774-9/98 16.6.2 IEDM 1998.

In this respect, there is still a need to improve the floating gate memory, in order to read the memory cell more effectively, even though the memory cell can flow relatively low current. In the present invention, multi-divided bit line architecture is introduced to reduce the parasitic capacitance of the bit line, and reduced swing sense amplifiers are used for reading the memory cell through the multi-divided local bit line. In particular, two-stage sensing scheme is realized for minimizing area penalty, and which improves read access time.

And, the memory cell can be formed from single crystal silicon on the surface of a wafer. Alternatively, the memory cell can be formed from thin film polysilicon layer, because the lightly loaded bit line can be quickly discharged by the memory cell even though the thin film memory cell can flow relatively low current. In doing so, multi-stacked NAND flash memory is realized with the thin film memory cell, which can increase the density of the flash memory within the conventional CMOS process with additional process steps.

SUMMARY OF THE INVENTION

In the present invention, two-stage sensing scheme is realized for reading the flash memory, such that a tiny local sense amp is devised in order to insert between memory cells, which minimizes area penalty and improves access time, wherein the local sense amp is connected to a global sense amp through a global bit line with two stage sense amps. By inserting as many as local sense amps, long bit line is multi-divided into short bit lines. With the short bit line architecture, bit line capacitance is significantly reduced, so that low current memory cell can be used for reading memory cell, and which may reduce programming time as well.

With the two stage sensing scheme, a stored data in a memory cell is transferred to a global latch circuit through the two-stage sense amps such that low data is transferred to the global latch circuit with high gain, but high data is not transferred with low gain. By the sense amps, a voltage difference in the bit line is converted to a time difference as an output of the global sense amp with gain. In this manner, a time-domain sensing scheme is realized to differentiate low data and high data stored in the memory cell. For instance, low data is quickly transferred to the global latch circuit through the sense amps with high gain, but high data is rejected by a locking signal based on low data as a reference signal.

More specifically, a reference signal is generated by one of fast changing data, such as low threshold data, with high gain from reference cells, which signal serves as a reference signal to generate a locking signal for a global latch circuit in order to reject latching another data, such as, high threshold data, which is slowly changed with low gain, so that low threshold data (in a charge trap region) is arrived first while high threshold data is arrived later. The time-domain sensing scheme effectively differentiates low threshold data and high threshold data with time delay control, while the conventional sensing scheme is current-domain or voltage-domain sensing scheme. In the convention memory, the selected memory cell charges or discharges a long and heavy bit line, and the changed voltage of the bit line is compared by a latch which determines an output at a time. In the present invention, there are many advantages to realize the time-domain sensing scheme, so that the sensing time is easily controlled by a tunable delay circuit, which compensates cell-to-cell variation and wafer-to-wafer variation, such that there is a need for adding a delay time before locking the global latch circuit with a statistical data for all the memory cells, such as mean time between fast data and slow data. Thereby the tunable delay circuit generates a delay for optimum range of locking time.

Furthermore, the time-domain sensing scheme is useful for reducing the cell current difference between the turn-on current of the low threshold data and the turn-off current of the high threshold data. In the conventional flash memory, there is at least several 1000 times difference between the turn-on current and the turn-off current, in order to read the memory cell with existing comparator or an inverter latch through heavy bit line. In the present invention, the current difference can be reduced, for example, to several 100 times instead of several 1000 times, as long as the distribution of the difference is stable at a given fabrication process for manufacturing because lightly loaded bit line can be driven by the weak memory cell through two-stage sense amps in the time domain, which means that the memory cell can be miniaturized further.

Furthermore, configuring the memory is more flexible, such that number of sense amps can be determined by the target speed. For example, high speed application needs more segmented array with more sense amps, while high density application needs more memory cells with reduced number of sense amps, thus cell efficiency is increased.

Furthermore, various alternative configurations are described for implementing the two-stage sense amps. And, example memory cell layout and cross sectional views are illustrated to minimize cell area. The fabrication method is compatible with the conventional CMOS process for realizing planar memory cell including the single-crystal-based transistor. Alternatively, LTPS (low temperature polysilicon) layer is used for forming thin film transistor as a memory cell, which realizes multi-stacked memory cells, so that the thin film memory cell can drive lightly loaded bit line (local bit line) even though thin film polysilicon transistor can flow lower current. And a body of the thin film transistor is connected to a bias voltage for alleviating self-heating problem in short channel thin film transistor. Furthermore, the memory cell can be formed from various semiconductor materials, such as silicon-germanium and germanium.

Furthermore, any type of floating gate device can be used as a storage device, such as MNOS (Metal-Nitride-Oxide Semiconductor), SONOS (Silicon-Oxide-Nitride-Oxide Semiconductor), MAOS (metal-alumina-oxide-semiconductor), MAS (metal-alumina-semiconductor), nanocrystal memory including nanocrystal layer, single electron memory including quantum dot, and so on.

Still furthermore, the sensing scheme is alternatively useful to read a NOR flash memory in the similar manner, wherein the NOR flash memory cell is read by the two-stage sense amps.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings which are incorporated in and form a part of this specification, illustrate embodiments of the invention and together with the description, serve to explain the principles of the invention.

FIG. 9B illustrates another alternative configuration for reading a NOR flash memory, according to the teachings of the present invention.

FIGS. 10A, 10B and 10C illustrate an example layout for the local sense amp and the sense amp, and FIG. 10D illustrates a related schematic for the example layout, according to the teachings of the present invention.

DETAILED DESCRIPTION OF PREFERRED EMBODIMENT(S)

Reference is made in detail to the preferred embodiments of the invention. While the invention is described in conjunction with the preferred embodiments, the invention is not intended to be limited by these preferred embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 1A:
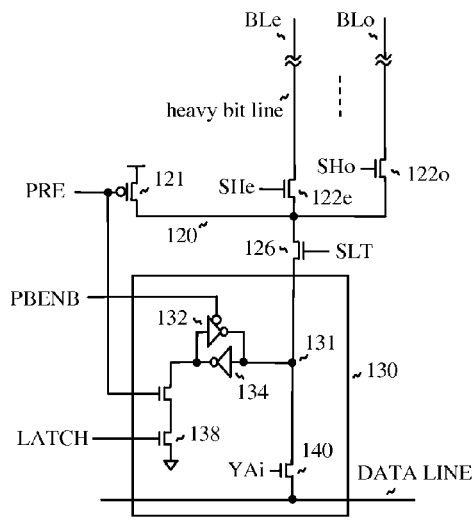
FIG. 1A illustrates a sensing circuit for NAND flash memory as a prior art.
Figure 1B:
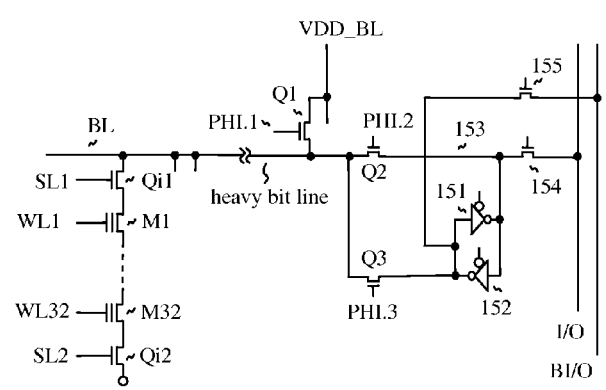
FIG. 1B illustrates another sensing circuit for NAND flash memory as a prior art.
Figure 2A:
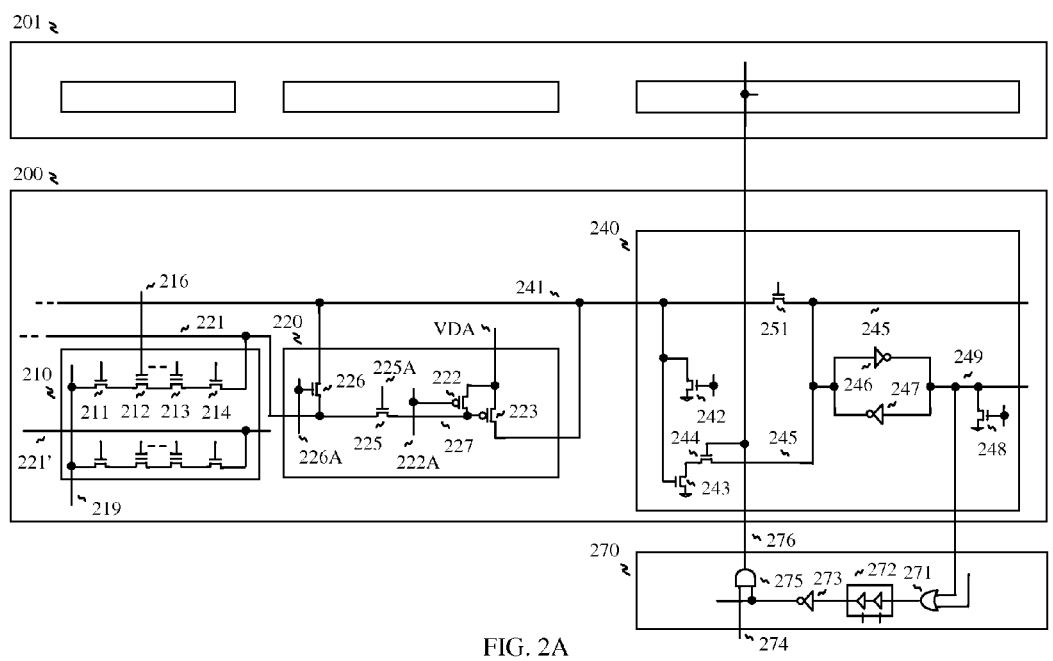
FIG. 2A illustrates a flash memory with two-stage sense amps.

The present invention is directed to flash memory with two-stage sensing scheme as shown in FIG. 2A, wherein a memory block 200 is composed of a NAND string 210, a local sense amp 220, a global sense amp 240, and a locking signal generator 270. NAND string 210 includes two local bit lines 221 and 221', wherein the NAND string includes a plurality of memory cells with a series connection even though the drawing illustrates two memory cells 212 and 213 for simplifying the schematic. The memory cell 212 is controlled by a word line 216, and the other memory cell 213 is controlled by the other word line. The memory string is serially connected to an upper select transistor 214 which is controlled by an upper select signal, and a lower select transistor 211 which is controlled by a lower select signal, where the upper select transistor 214 is connected to the local bit line 221 and the lower select transistor 211 is connected to a source line 219. And the other local bit line 221' is connected to the other NAND string.

The local sense amp 220 is composed of a local dynamic read circuit and a local write circuit, wherein the local dynamic read circuit includes a local read transistor 225 for connecting the local bit line 221 to a local amp node 227, a local pre-charge transistor 222 for pre-charging the local amp node 227, and a local amplify transistor 223 which reads a discharge time of the local amp node 227 whether charging a global bit line 241 or not, during read operation, and the local write circuit includes a local write transistor 226 for connecting the local bit line 221 to the global bit line 241 during write operation.

The global sense amp 240 is composed of a global dynamic read circuit, a global latch circuit, and a global write circuit, wherein the global dynamic read circuit includes a global reset transistor 242 for resetting the global bit line 241, a global amplify transistor 243 for reading the global bit line 241, and a global select transistor 244 for configuring a global series connection with the global amplify transistor 243, and the global latch circuit is connected to the global series connection through a positive latch node 245 for receiving the read data, wherein the global latch circuit includes two cross-coupled inverters having 246 and 247 for latching the read data from the global dynamic read circuit and a write data from a data bus (not shown). And the global latch circuit is connected to a latch reset transistor 248 through a negative latch node 249 for resetting the global latch circuit. The global write circuit includes a global write transistor 251 for transferring the write data to the global bit line 241, and the global write transistor 251 is connected to the positive latch node 245 for transferring the write data.

For reading stored data in the memory cell, a read path is set up from the memory cell to the global sense amp 240 through the local bit line 221, the local dynamic read circuit of the local sense amp 220, the global bit line 241 and the global dynamic read circuit of the global sense amp 240.

The locking signal generator 270 generates a delayed signal as a locking signal 276 for locking the global dynamic read circuit, wherein the locking signal generator 270 receives a latched signal from the global latch circuit as a reference signal based on at least a reference memory cell. The locking signal generator 270 is composed of an OR gate 271 for receiving the reference signal from the global latch circuit, a tunable delay circuit 272 (shown in FIG. 8A) for adjusting delay time, an inverting buffer 273 and an AND gate 275 for generating the locking signal 276, wherein the AND gate 275 receives a global read enable signal 274 when reading. And during read operation, the memory block 200 serves as a reference memory column (or reference memory block) for locking main memory block 201, which realizes the time-domain sensing scheme, where the memory block 200 stores low threshold data for generating the locking signal. Configuration of the main memory block 201 is the same as that of the reference memory block 200, but the main memory block 201 stores data.

When reading data "0" (low threshold data) from the memory cell 212, a current flow is measured by the local sense amp 220, such that the local write transistor 226 is turned off by de-asserting the program control signal 226A for releasing the local bit line 221. And then the local read transistor 225 is turned on by asserting the local read control signal 225A to higher than VDA+VT voltage, while the pre-charge transistor 222 is turned on, where the VT voltage is threshold voltage of the transistor and the VDA is a supply voltage of the local amplify transistor 223. After raising the local bit line 221, the pre-charge transistor 222 is turn off. After then, the memory cell 212 is turned on, for measuring the memory cell, by asserting the word line 216 (said control gate) to a pre-determined read voltage, and also unselected memory cell 213 is bypassed with VPASS voltage (which is higher than the pre-determined read voltage) by asserting unselected word line. And also the upper select transistor 214 is turn on, and the lower select transistor 211 is also turned on, while the source line 219 keeps low. By asserting the word line 216, the local bit line 221 is discharged through the memory cell storing low threshold data (data "0"). Hence, the global bit line 241 is quickly charged by the local dynamic read circuit of the local sense amp 220. As a result, the global latch node 249 of the global sense amp is discharged to low by the global dynamic read circuit, and the changed read data is latched to the global latch circuit.

In order to improve read access time, the local bit line 221 is shorter than that of conventional array architecture for reducing capacitive loading. For instance, the local bit line loading is 1/128 or 1/256, compared with the conventional long bit line. However, by dividing the bit line into short lines, more sense amps are required. Thus, each sense amp should occupy a small area for inserting between the divided memory arrays. Furthermore, the two-stage sense amps are more useful for reading the memory cell with minimum area penalty (by inserting multiple local sense amps), such that the local sense amp 220 includes four transistors.

In contrast, when reading data "1" (high threshold data), the local bit line 221 is not discharged because the selected memory cell 212 is not turned on, thus the local bit line 221 is not changed at a short time or very slowly discharged by turn-off current of the memory cell. Thereby the local amplify transistor 223 does not set up a strong current path but sets up very weak current path with leakage current to the global bit line 241. Hence, the global bit line is very slowly charged. As a result, the global latch node of the global sense amp is not changed during a predetermined time because the locking signal locks the global sense amp, such that the latch node keeps the pre-charged state. In doing so, data "1" is not arrived to the global latch circuit, such that the current difference of the selected memory cell is converted to the time difference with gain difference of the sense amps. Thus data "0" serves as a reference signal to reject latching data "1" to the global latch circuit for differentiating the fast data (low threshold data) and the slow data (high threshold data) in a time domain, which is called "time-domain sensing scheme".

When writing, a write path is set up from the global latch circuit to the memory cell through the global write transistor 251, the global bit line 241, the local write transistor 226, and the local bit line 221. For writing (programming), a write data is supplied to the global write transistor 251 for driving the global bit line. And write operation (programming) is executed through the local write transistor 226. A data is transferred to the selected memory cell of the selected NAND string 210 through the global bit line 241 which is driven by the global write circuit 251. Before program, erase operation is executed. More detailed explanation will be followed as below.

With the two-stage sensing scheme including the local sense amp and the global sense amp, read access time is enhanced with quick discharging of the bit line because the memory cell drives only lightly loaded short bit line. And bit line capacitance is significantly reduced with the short bit line architecture, so that low current memory cell can be used for reading memory cell, and which may reduce programming time as well. Furthermore, the time-domain sensing scheme is useful for reducing the cell current difference between the turn-on current of the low threshold data and the turn-off current of the high threshold data. In the conventional flash memory, there is at least several 1000 times difference between the turn-on current and the turn-off current, in order to read the memory cell with existing comparator or an inverter latch through heavy bit line. In the present invention, the current difference can be reduced, for example, to several 100 times instead of several 1000 times, as long as the distribution of the difference is stable at a given fabrication process for manufacturing because lightly loaded bit line can be driven by the weak memory cell through two-stage sense amps in the time domain, which means that the memory cell can be miniaturized further.

Figure 2B:
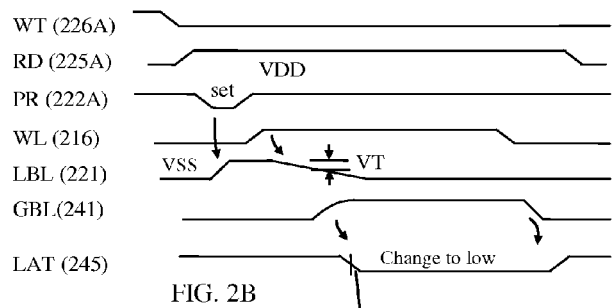
FIG. 2B illustrates a timing diagram for reading low threshold data with the sensing scheme.

Referring now to FIG. 2B in view of FIG. 2A, a timing diagram for reading low threshold data is illustrated. To read data, the local write transistor 226 is turned off for releasing the local bit line (LBL) 221 by de-asserting the write (program) control signal (PG) 226A to ground voltage. And then, the local read transistor 225 is turned on by asserting the read control signal (RD) 225A to higher than VDD+VT for avoiding threshold voltage drop. Then the pre-charge (PR) signal 222A is lowered from high to low for pre-charging the local bit line 221 to VDD voltage. After pre-charging, the pre-charge signal 222A is returned from low to high for releasing the local bit line 221. After then, the word line 216 serving as a control gate is raised to predetermined voltage, in order to measure the selected memory cell 212, and the unselected memory cell 213 is bypassed by raising the gate to VPASS voltage which is enough high to turn on the high threshold memory cell. And, the select transistor 214 is turned on, which sets up a current path from the local bit line 221 to the source line 219 connecting to ground voltage. By the current path, the local bit line 221 is discharged to ground voltage, when reading data "0" (low threshold data).

When the local bit line 221 is discharged by the selected memory cell storing low threshold data. The local amplify transistor 223 is turned on, which charges the global bit line 241. Charging the global bit line (GBL) 241, the global amplify transistor 243 is turned on when the global select transistor 244 is turned on to enable the global amplify transistor 243. Thus the global latch node (LAT) 249 is discharged to ground voltage from pre-charged voltage VDD, while the global reset transistor 242 is turned off.

During read operation, no phase control signal is used, such that the cell data is immediately transferred to the global latch node (LAT) 249 through the read path. Hence, read control is relatively simple, which also realizes fast access with lightly loaded bit line. After reading the data, the pre-charge (PR) signal 222A, the word line, and other control signals are returned to pre-charge state or standby mode.

Figure 2C:
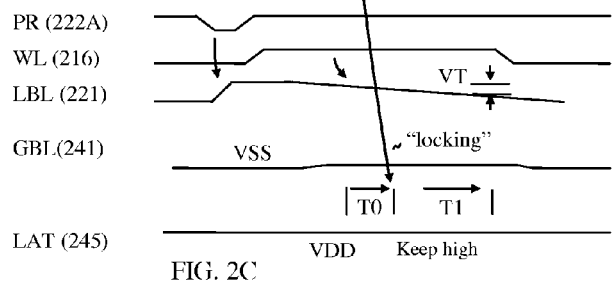
FIG. 2C illustrates a timing diagram for reading high threshold data with the sensing scheme, according to the teachings of the present invention.

Referring now to FIG. 2C in view of FIG. 2A, detailed read timing diagram for data "1" (high threshold data) is illustrated, wherein the local amplify transistor 223 in the local sense amp 220 is not strongly turned on, which does not pull up the global bit line 241, because the local bit line (LBL) 221 is not discharged by the memory cell when the high threshold data is stored in the charge trap region. Thereby, the global latch node (LAT) 249 keeps high. However, the local bit line 221 is slowly discharged by leakage current and the global bit line (GBL) 241 is also slowly charged by the turn-off current. When the local bit line 221 is reached to VDD-VT voltage, the PMOS transistor 223 starts to turn on and pulls up the gate of the global amplify transistor 243, which may change the global latch node. In order to avoid the false flip with the leakage current, the reference signal is generated by low threshold data with delay time as shown T0, so that the timing margin T1 is defined to reject the high threshold data to be latched to the global latch circuit.

Figure 3A:
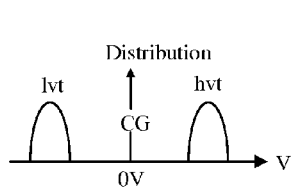
FIG. 3A illustrates a distribution graph for binary level memory cells.
Figure 3B:
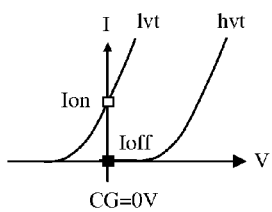
FIG. 3B illustrates I-V curve of the binary level memory cell.
Figure 3C:
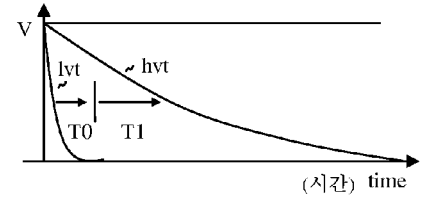
FIG. 3C illustrates discharge times of local bit line for low threshold data and high threshold data.
Figure 3D:
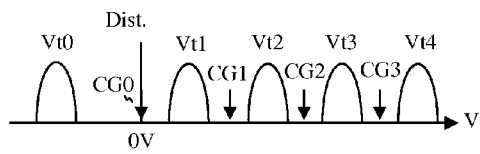
FIG. 3D illustrates a distribution graph of the multi-level memory cells, according to the teachings of the present invention.

In FIG. 3A, a distribution graph for binary level memory cell is illustrated, wherein the distribution of the low threshold data of the memory cell "lvt" is lower than that of the high threshold data of the memory cell "hvt". Hence, the current flow of the "lvt" memory cell "Ion" is higher than that of the "hvt" memory cell "Ioff" at a given control gate (word line) voltage (CG=0V), as shown in FIG. 3B. And in FIG. 3C, discharge times of the local bit line for low threshold data and high threshold data are illustrated, such that discharge time of high threshold data is defined as T0+T1. Thereby, the best locking time is regarded as T0, only if T0 is an optimum time between low threshold data and high threshold data in the discharge time. However, it is not necessary that T0 is middle where the "Ioff" current is very low. Thus, the delay time T0 should be optimized after collecting statistical data of the distribution of the memory cells. In FIG. 3D, a distribution graph of the multi-level memory cell is illustrated, wherein the threshold voltage Vt0, Vt1, Vt2, Vt3, and Vt4 are defined for storing four-level data, and the control gate voltage CG0, CG1, CG2, and CG3 are forced in order to measure each level of data, respectively.

Figure 4A:
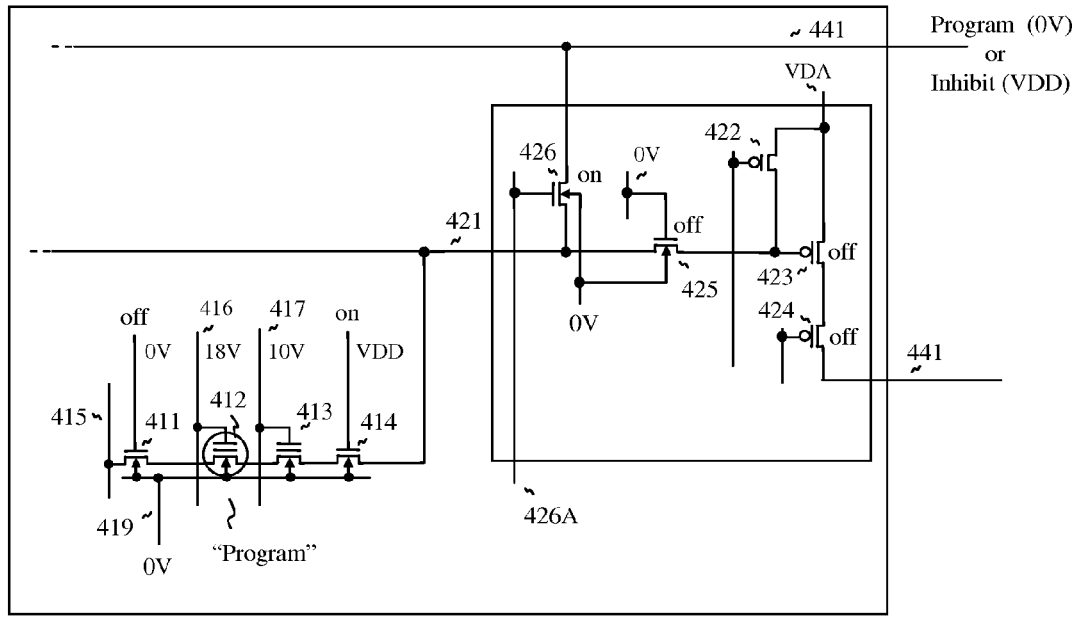
FIG. 4A illustrates a related circuit schematic for programming.

In FIG. 4A, a simplified circuit schematic for programming is illustrated, In order to program the memory cell (to store high threshold data), the local write transistor 426 is turned on for lowering the local bit line to low, by asserting the program control signal 426A to VDD or higher than VDD+VT voltage, while the local read transistor 425 is turned off and amplifying transistors including the local pre-charge transistor 422, the local amplify transistor 423 (which is connected to the VDA voltage) and the local select transistor 424 of the local sense amp are also turned off. The global bit line 441 keeps low. And a selected word line 416 is asserted to a predetermined program voltage (for example, VPGM voltage=18V) for activating the memory cell 412 while another word line 417 of the unselected memory cell 413 is forced to VPASS voltage, for example, 10V. And more memory cells can be serially connected even though a few memory cells are shown in the drawing for ease of understanding. During program, high voltage is forced to the selected memory cell 412 from the selected word line 416 (18V) to body 419 (0V) while the unselected memory cell 413 is not programmed with reduced gate voltage (10V). In contrast, for inhibiting program (to keep low threshold data from erased state), the local bit line 421 is sustained near VDD by keeping the global bit line 441 to VDD voltage while the local write transistor 426 is turned on.

Figure 4B:
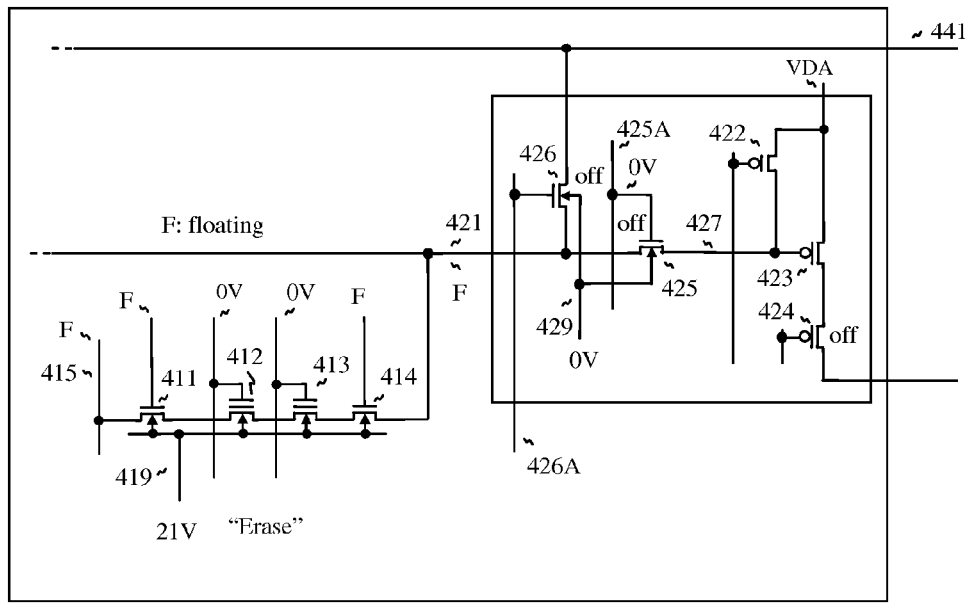
FIG. 4B illustrates a related circuit schematic for erasing, according to the teachings of the present invention.

In FIG. 4B, a simplified circuit schematic for erasing is illustrated, wherein a p-well 419 for NAND string is forced to erase voltage (for example, 21V). The source line 415 is floating. And the local bit line 421 is floating as well, while turning off the write transistor 426 and the local read transistor 425. More specifically, the local write transistor 426 and the local read transistor 425 are formed on a separate p-well 429, which is forced to ground voltage, for establishing a reverse bias from the local bit line (n-type drain) to the separate p-well 429 (0V). And the local pre-charge transistor 422, the local amplify transistor 423 (which is connected to the VDA voltage) and the local select transistor 424 in the local sense amp are turned off. During erase, the control gates of the memory cells 416 and 417 are forced to low (0V), and the selector signals 411 and 414 are floating. Alternatively, for reducing gate stress, the global bit line 441 keeps high while the local write transistor 426 is still turned off.

Figure 5:
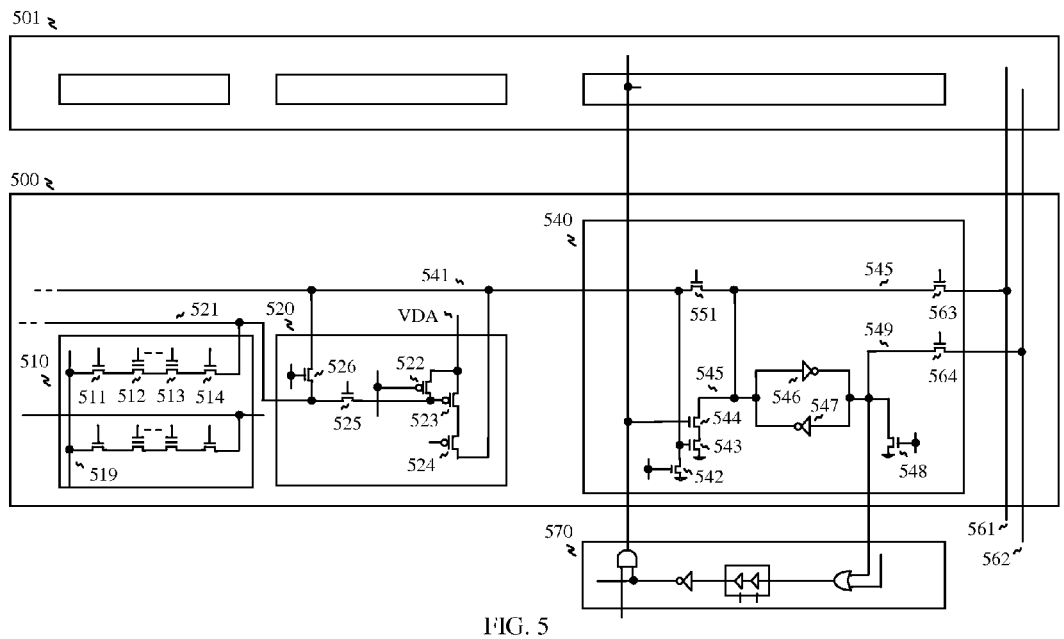
FIG. 5 illustrates alternative configuration with two-stage sensing scheme for the NAND flash memory, according to the teachings of the present invention.

In FIG. 5, alternative configuration with two-stage sensing scheme for the NAND flash memory, wherein a memory block 500 is composed of a NAND string 510, a local sense amp 520, a global sense amp 540, and a locking signal generator 570. NAND string 510 includes two local bit lines 521 and 521', such that the memory cell 512 is controlled by a word line 516, and the other memory cell 513 is controlled by the other word line. The memory string is serially connected to an upper select transistor 514 which is controlled by an upper select signal, and a lower select transistor 511 which is controlled by a lower select signal, where the upper select transistor 514 is connected to the local bit line 521 and the lower select transistor 511 is connected to a source line 519.

The local sense amp 520 includes a local series connection, wherein the local sense amp is composed of a local dynamic read circuit and a local write circuit, such that the local dynamic read circuit includes the local read transistor 525 for connecting the local bit line 521 to a local amp node 527, a local pre-charge transistor 522 for pre-charging the local amp node 527, and a local amplify transistor 523 which reads a discharge time of the local amp node 527 whether charging a global bit line 541 or not, when a local select transistor 524 is turned on, during read operation. The local amplify transistor 523 and the local select transistor 524 configure a local series connection for transferring the read data to the global latch circuit when reading. And the local write circuit includes a local write transistor 526 for connecting the local bit line 521 to the global bit line 541 during write operation.

The global sense amp 540 is composed of a global dynamic read circuit, a global latch circuit, and a global write circuit, wherein the global dynamic read circuit includes a global reset transistor 542 for resetting the global bit line 541, a global amplify transistor 543 for reading the global bit line 541, and a global select transistor 544 for configuring a global series connection with the global amplify transistor 543, and the global latch circuit is connected to the global series connection through a positive latch node 545 for receiving the read data, wherein the global latch circuit includes two cross-coupled inverters having 546 and 547 for latching the read data from the global dynamic read circuit and a write data from a data bus 561 and 562 through a data transfer circuit including a pair of transfer transistors 563 and 564. And the global latch circuit is connected to a latch reset transistor 548 through a negative latch node 549 for resetting the global latch circuit. The global write circuit includes a global write transistor 551 for transferring the write data to the global bit line 541, and the global write transistor 551 is connected to the positive latch node 545 for transferring the write data. The locking signal generator 570 is configured as shown 270 of FIG. 2A for locking the main memory column 501. And the read path is set up by turning on the local series connection with the local select transistor 524, while other operations are similar to that of FIG. 2A. Thus, detailed operations are not explained.

Figure 6:
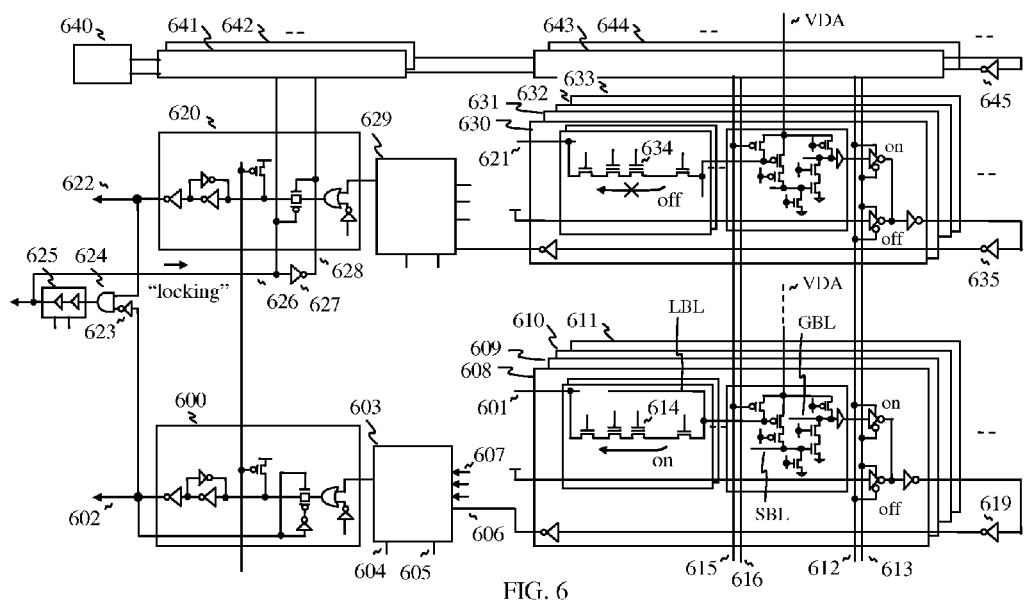
FIG. 6 illustrates a related circuit schematic for reading multi-level memory cell, according to the teachings of the present invention.

In FIG. 6, a circuit schematic for reading multi-level memory cell is illustrated. In order to read multi-level data from the memory cell, multiple reference signals are used to measure each level, wherein the memory cell 614 in the memory block 608 stores the first threshold data (Vt0 in FIG. 3D), the memory cells in the memory block 609 stores the second threshold data (Vt1), the memory cells in the memory block 610 stores the third threshold data (Vt2), the memory cells in the memory block 611 stores the fourth threshold data (Vt3), in order to measure four level threshold data. More levels can be measured only if more reference signals are generated by each reference cell storing the related threshold data, even though the drawing depicts only four memory blocks for measuring four levels. When the first level is measured, the first reference signal is selected by the block selector signals 612 (low) and 613 (high), and pre-charge signal 615 (high) and column select signal 616 (low) are also asserted. And, selected memory cell 614 is turned on, thus output of sense amp is transferred to output 602 of the latch 600 through the local bit line (LBL) and the global bit line (GBL) of the two-stage sense amps and the selector circuit 603, an inverter 619 and buffer, where the drawing illustrates only one stage sense amp for ease of understanding. When the memory block 608 is selected, the selector circuit 603 selects the output 606 with the selector input 604 and 605, where more detailed operation of the selector circuit 603 will be explained as below in FIG. 8D. Thus, the output 606 from the memory block 608 is bypassed to the selector circuit 603 and reached to the global latch circuit 600. In doing so, the output 606 changes the latch output 602, which signal locks the latch (600) itself. And then the output 602 changes the locking signal 626 through an inverter 623, AND gate 624 and a tunable delay circuit 625, so that other latches 620, 641 and 642 are locked by the locking signals 626 and 628 (inverted signal by inverter 627). While first threshold memory cell 614 generates a reference signal, memory cell 634 storing the second threshold data (Vt1) in the memory block 630 is turned off. Hence, inverter 635 keeps pre-charged state and the output 622 keeps high.

One aspect of using two reference cells for generating a reference signal is that the reference signal can be used for characterizing the relation between the first threshold data (in the cell 614) and the second threshold data (in the cell 634). Thereby the AND gate 624 always compares the output data from low threshold data and high threshold data. As a result, the locking signal 626 is generated only if two reference cells generate each signal correctly. Otherwise, the locking signal is not generated. For example, the second threshold (Vt1) memory cell 634 stores negative charges in the charge trap region, which memory cell usually turned off when reading the first threshold data (Vt0). However, the memory cell 634 (storing the second threshold data) may be turned on if the stored charges in the charge trap region are reduced after frequent access. And the memory cell 614 (storing the first threshold data) is usually turned on when reading, but the memory cell may be turned off if some charges are trapped in the charge trap region after frequent access. In either case, the locking signal 626 is not generated. By measuring the locking signal or reference signal, the system can check whether the memory block works correctly or not.

For measuring the second level, the memory block 609 and 631 are selected during next cycle, such that the second voltage level (CG1) is asserted to the memory block 609, and the third voltage level (CG2) is asserted to the memory block 631 where the memory block 609 stores the second threshold data (Vt1) and the memory block 631 stores the third threshold data (Vt2). Thus, the locking signal 626 is generated as long as the memory cells work correctly. And the selector circuits 603 and 629 select the signals from the memory block 609 and 631, respectively. In the similar manner, the third level is measured by the memory block 610 (storing the third threshold data) and the memory block 632 (storing the fourth threshold data). And the fourth level is measured by the memory block 611 (storing the fourth threshold data) and the memory block 633 (storing the fifth threshold data), consecutively. Thus, the main memory blocks 643 and 644 are measured by using the locking signals for each level, respectively. And the output data is transferred to the global latch circuits 641 and 642 through inverter 645. The latched output is shifted to shifter register 640, where the shifter register 640 is composed of conventional flip-flop circuits. And the local amplify transistor of the local sense amp is powered by the VDA voltage which is generated by a pull-up transistor 651.

Figure 7:
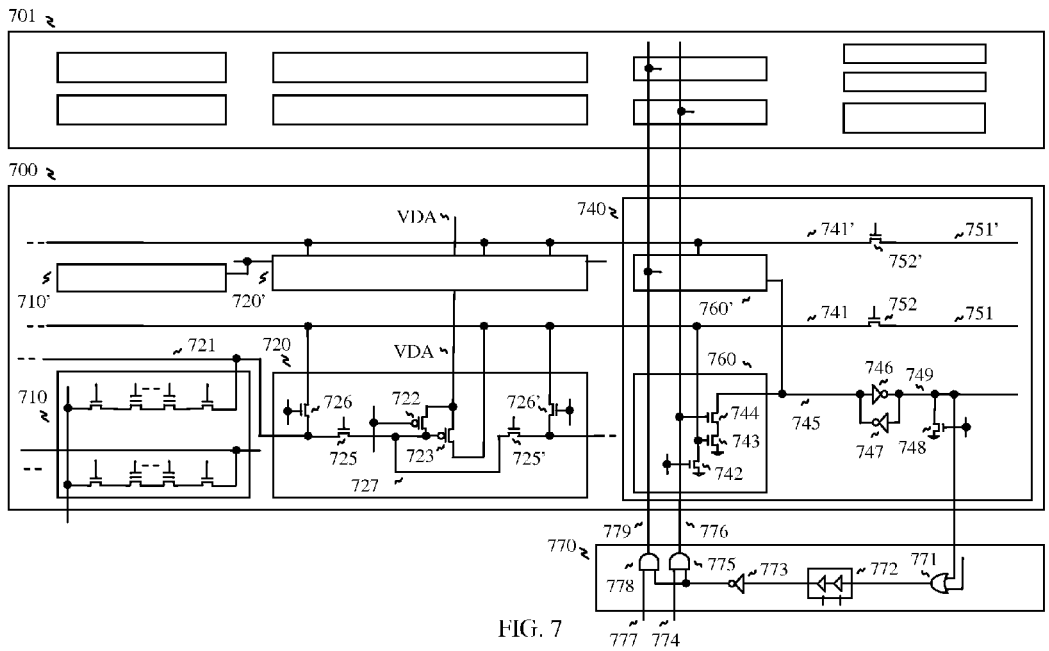
FIG. 7 illustrates an alternative configuration with two-stage sensing scheme for decoding multiple columns, according to the teachings of the present invention.

In FIG. 7, alternative configuration with two-stage sensing scheme for the NAND flash memory, wherein a memory block 700 is composed of NAND strings 710 and 710', local sense amps 720 and 720', a global sense amp 740, and a locking signal generator 770, in order to decode one of two columns. NAND string 710 is the same as that of FIG. 2A. When reading data, one of two local sense amps is selected, such that one of two local pre-charge transistors is released from the pre-charge state for setting up the read path. And when writing, one of two local write transistors is turned on, and one of two global write transistors is turned on for setting up the write path.

The local sense amp 720 is composed of a local dynamic read circuit and a local write circuit, wherein the local dynamic read circuit includes a local read transistor 725 for connecting the local bit line 721 to a local amp node 727, a local pre-charge transistor 722 for pre-charging the local amp node 727, and a local amplify transistor 723 which reads a discharge time of the local amp node 727 whether charging a global bit line 741 or not. The local amplify transistor 723 is supplied by the VDA voltage generator (shown in FIG. 8E). And another local read transistor 725' for connecting the other-side of local bit line to the local amp node 727, for sharing the local pre-charge transistor 222 and the local amplify transistor 223. And the local write circuit includes a left local write transistor 726 for connecting the local bit line 721 to the global bit line 741, and a right local write transistor 726' for connecting a right local bit line to the global bit line 741, during write operation.

The global sense amp 740 is composed of two global dynamic read circuits 760 and 760', a global latch circuit, and two global write circuits, wherein the global dynamic read circuit includes a global reset transistor 742 for resetting the global bit line 741, a global amplify transistor 743 for reading the global bit line 741, and a global select transistor 744 for configuring a global series connection with the global amplify transistor 743, and the global latch circuit is connected to the global series connection through a positive latch node 749 for receiving the read data, wherein the global latch circuit includes two cross-coupled inverters having 746 and 747 for latching the read data from the global dynamic read circuit and a write data from a data bus (not shown). And the global latch circuit is connected to a latch reset transistor 748 through a negative latch node 749 for resetting the global latch circuit. The global write circuit includes a global write transistor 751 for transferring the write data to the global bit line 741, and another global write transistor 751' for transferring the write data to the other global bit line 741'.

The locking signal generator 770 generates a delayed signal as a locking signal 776 for locking the global dynamic read circuit, wherein the locking signal generator 770 receives a latched signal from the global latch circuit as a reference signal based on at least a reference memory cell. The locking signal generator 770 is composed of an OR gate 771 for receiving the reference signal from the global latch circuit, a tunable delay circuit 772 (shown in FIG. 8A) for adjusting delay time, an inverting buffer 773, an AND gate 775 and another AND gate 778 for generating two locking signals 776 and 779, wherein the AND gate 775 receives a global read enable signal 774, and the other AND gate 778 receives a global read enable signal 777. And during read operation, the memory block 700 serves as a reference memory column (or reference memory block) for locking main memory block 701, which realizes the time-domain sensing scheme, where the memory block 700 stores low threshold data for generating the locking signal. Configuration of the main memory block 701 is the same as that of the reference memory block 700, but the main memory block 701 stores data.

Figure 8A:
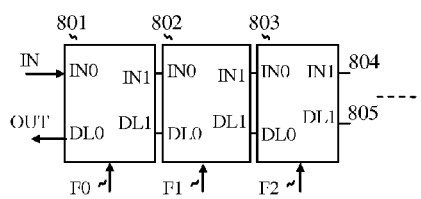
FIG. 8A illustrates a tunable delay circuit.

In FIG. 8A, more detailed tunable delay circuit (as shown 271 in FIG. 2A) is illustrated, wherein multiple delay units 801, 802 and 803 are connected serially, the first delay unit 801 receives input IN and generates output OUT, the second delay unit 802 is connected to the first delay unit, and the third delay unit 803 is connected to the second delay unit 802 and generates outputs 804 and 805, and so on. Each delay unit receives a fuse signal, such that the first delay unit receives F0, the second delay unit receives F1, and the third delay unit receives F2. And more detailed delay unit is illustrated in FIG. 8B, wherein the delay unit 810 receives an input IN0 and a fuse signal Fi, thus the fuse signal Fi selects output from the input IN0 or input DL1, so that a transfer gate 811 is turned on when the fuse signal Fi is low and output of inverter 813 is high, otherwise another transfer gate 812 is turned on when the fuse signal Fi is high and output of inverter 813 is low to bypass DL1 signal. Inverter chain 814 and 815 delays IN0 signal for the next delay unit, where more inverter chains or capacitors can be added for the delay even though the drawing illustrates only two inverters.

Figure 8C:
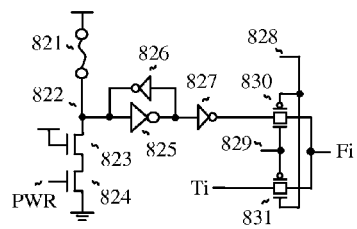
FIG. 8C illustrates a related fuse circuit of the tunable delay circuit.
Figure 8B:
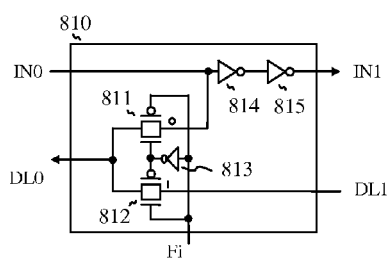
FIG. 8B illustrates a delay unit of the tunable delay circuit.

In FIG. 8C, a related fuse circuit of the tunable delay circuit as shown in FIG. 8A is illustrated, wherein a fuse 821 is connected to a latch node 822, a cross coupled latch including two inverters 825 and 826 are connected to the latch node 822, pull-down transistors 823 and 824 are serially connected to the latch node 822 for power-up reset. Transfer gate 830 is selected by a select signal 829 (high) and another select signal 828 (low) in order to bypass the latch node voltage 822 through inverter 825 and 827. In doing so, fuse data is transferred to output node Fi, otherwise, test input Ti is transferred to Fi when a transmission gate 831 is turned on.

Figure 8D:
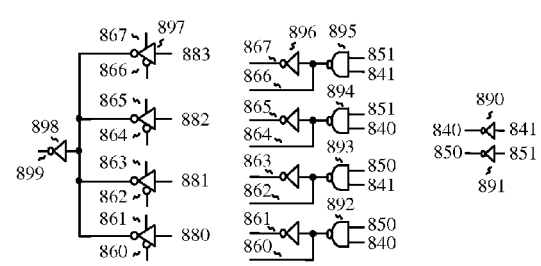
FIG. 8D illustrates a related selector circuit (as shown 603 in FIG. 6)

In FIG. 8D, detailed selector circuit (as shown 603 and 629 in FIG. 6) is illustrated. In order to select a signal from four data inputs 880, 881, 882, and 883, one of four tri-state inverters are selected, respectively, such that input 880 is transferred to output node 899 through inverter 898 when selector signal 860 is low and another selector signal 861 is high to turn on the related tri-state inverter. In the similar manner, input 881 is transferred to output node 899 through inverter 898 when selector signal 862 is low and another selector signal 863 is high to turn on the related tri-state inverter. Input 882 is transferred to output node 899 through inverter 898 when selector signal 864 is low and another selector signal 865 is high to turn on the related tri-state inverter. And input 883 is transferred to output node 899 through inverter 898 when selector signal 866 is low and another selector signal 867 is high to turn on the related tri-state inverter 897. When a tri-state inverter is selected, the other tri-state inverters are not selected, such that one of four-input-NAND gates 892, 893, 894 and 895 is asserted to low by selector inputs 841 and 851. Selector inputs 841 and 851 are inverted to generate negated outputs 840 and 850 by inverter 890 and 891 respectively, in order to decode the NAND gates 892, 893, 894 and 895, respectively. And inverter 896 and others generate inverting signals 861, 863, 865 and 867 to select the related tri-state inverters to bypass the related data inputs.

Figure 8E:
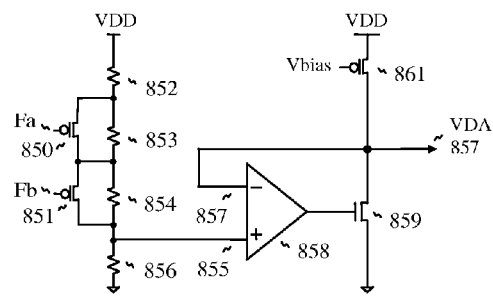
FIG. 8E illustrates a variable voltage generator for generating the read voltage, according to the teachings of the present invention.

In FIG. 8E, a variable voltage regulator is illustrated for supplying the variable the read voltage VDA to the reduced swing amplifiers, wherein a reference voltage 855 is generated by a variable voltage reference circuit, such that a first resistor 852 is connected to a second resistor 853, the second resistor 853 is connected to a third resistor 854, and the third resistor 854 is connected to a fourth resistor 856, serially. Hence, the supply voltage VDD is reduced to the reference voltage output 855 by the ratio of the resistance value. And the reference voltage output 855 is tunable with turn-on or turn-off state of the transistors 850 and 851. In addition, the transistors are controlled by control signals Fa and Fb, respectively. And the control signals Fa and Fb are generated by the fuse circuit as shown in FIG. 8C, where turn-on resistance of the transistor is much smaller than the resistance value of the resistor. And the reference voltage 855 is buffered by an op amp 858, so that the variable voltage VDA is generated by the op amp 858 and a big driver transistor 859. Generally, a voltage difference between two op amp inputs 855 and 857 is equal or very close. In doing so, the read voltage VDA is almost equal to the reference voltage 855. And a weak current sink transistor 861 is connected to the VDA voltage output 857 for stabilizing the output, wherein the current sink transistor 861 is controlled by a bias voltage Vbias.

Figure 9A:
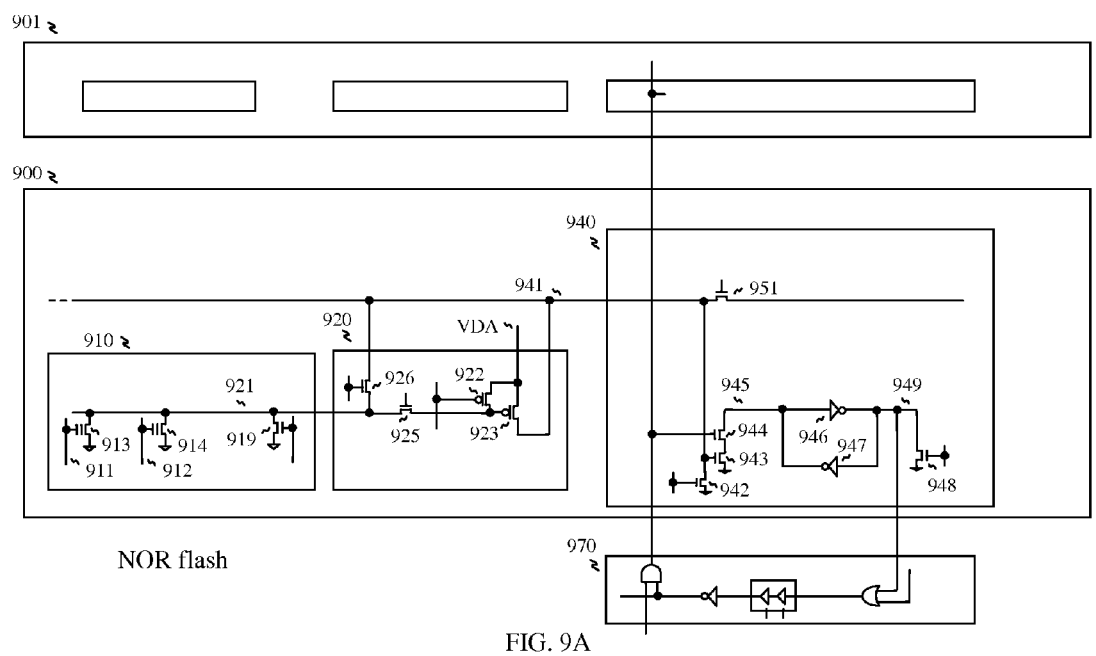
FIG. 9A illustrates alternative configuration for reading a NOR flash memory.

In FIG. 9A, alternative configuration for reading a NOR flash memory is illustrated, wherein most of circuits are same as NAND flash memory, except having NOR string, in order to configure the two-stage sensing scheme. More specifically, a memory block 900 comprises a NOR string 910, a local sense amp 920, a global sense amp 940, and a locking signal generator 970. The NOR string 910 includes a memory cell array configuring a NOR flash memory, such that the memory cell array includes memory cells 913 and 914, wherein the memory cell 913 is controlled by a word line 911 and the other memory cell 914 is controlled by the other word line 912. The memory cell array is connected to the local bit line 921. And a local reset transistor 919 is also connected to the local bit line 921 alternatively, which keeps the local bit line at ground voltage during standby.

The local sense amp 920 is composed of a local dynamic read circuit and a local write circuit, wherein the local dynamic read circuit includes a local read transistor 925 for connecting the local bit line 921 to a local amp node 927, a local pre-charge transistor 922 for pre-charging the local amp node 927, and a local amplify transistor 923 which reads a discharge time of the local amp node 927 whether charging a global bit line 941 or not. And the local write circuit includes a local write transistor 926 for connecting the local bit line 921 to the global bit line 941 during write operation.

The global sense amp 940 is composed of a global dynamic read circuit, a global latch circuit, and a global write circuit, wherein the global dynamic read circuit includes a global reset transistor 942 for resetting the global bit line 941, a global amplify transistor 943 for reading the global bit line 941, and a global select transistor 944 for configuring a global series connection with the global amplify transistor 943, and the global latch circuit is connected to the global series connection through a positive latch node 945 for receiving read data, wherein the global latch circuit includes two cross-coupled inverters having 946 and 947 for latching the read data from the global dynamic read circuit and a write data from a data bus (not shown). And the global latch circuit is connected to a latch reset transistor 948 through a negative latch node 949 for resetting the global latch circuit. The global write circuit includes a global write transistor 951 for transferring the write data to the global bit line 941.

During standby, the local bit line 921 is reset to ground voltage by turning on a reset transistor 919. When reading data "0" (low threshold data), the reset transistor 919 is turned off for releasing the local bit line 921 from the reset state. And then, the local pre-charge transistor 922 is turned on to pre-charge the local bit line 921 to the VDA voltage as a supply. After pre-charging, the local pre-charge transistor 922 is turned off. Then, the word line 911 is asserted to a pre-determined voltage for measuring the memory cell 913 while unselected word line 912 keeps low state. Thus, the local bit line 921 is discharged through the selected memory cell 913. Discharging the local bit line 921, the local amplify transistor 923 sets up a strong current path to the global bit line 941. Hence, the global bit line 941 is quickly charged while the global reset transistor 942 is turned off. And, the global amplify transistor 943 of the global sense amp 940 quickly discharges the global latch node 945 when the global select transistor 944 is turned on.

In contrast, when reading data "1" (high threshold data), the local bit line 921 is not discharged because the selected memory cell is not turned on, thus the local bit line 921 is not changed at a short time or very slowly discharged by turn-off current of the memory cell. Thereby the local amplify transistor 923 does not set up a strong current path but sets up very weak current path with leakage current to the global bit line 941. Hence, the global bit line is very slowly charged. As a result, the global latch node 945 of the global sense amp is not changed during a predetermined time. In doing so, data "1" is not arrived to the global latch circuit, such that the current difference of the selected memory cell is converted to time difference with gain difference of the sense amps. Thus data "0" serves as a reference signal to reject latching data "1" to the global latch circuit for differentiating the fast data (low threshold data) and the slow data (high threshold data) in a time domain.

The locking signal generator 970 is same as that of FIG. 9A. And during read operation, the memory block 900 serves as a reference memory column for locking main memory block 901, which realizes the time-domain sensing scheme, where the memory block 900 stores low threshold data for generating the locking signal. Configuration of the main memory block 901 is the same as that of the reference memory block 900, but the main memory block 901 stores data.

For erasing, the local bit line is sustained to VSS voltage by turning on the local write transistor 926 while the reset transistor 919 is turned off, and the selected word line is asserted to a pre-determined erase voltage, for example −10V. After then for programming, the local bit line voltage is raised to a pre-determined program voltage through the local write transistor 926 and the global write transistor 951, for example 6V, while the selected word line is also asserted to a program word line voltage, for example 10V. And the local write transistor 926 transfers output of the global bit line voltage which is driven by a level shifter 950 (not shown) through the global write transistor 951. And during erase and program, the local pre-charge transistor 922 keeps turn-off state, and other read path is also turned off.

In FIG. 9B, alternative configuration for reading a NOR flash memory is illustrated, wherein most of circuits are same as that of FIG. 9A, except the local sense amp. More specifically, the local sense amp 920' is composed of a local dynamic read circuit and a local write circuit, wherein the local dynamic read circuit includes a local read transistor 925' for connecting the local bit line 921' to a local amp node, a local pre-charge transistor 922 for pre-charging the local amp node, and a local amplify transistor 923 which reads a discharge time of the local amp node whether charging a global bit line 941 or not, where the local amplify transistor 923 configures a local series connection with a local select transistor 924' for selecting. And operations are also same as above in FIG. 9A for locking the reference column 900' and the main column 901' with the global sense amp 940' and the locking signal generator 970'.

Methods of Fabrication

The memory cells can be formed from single crystal silicon as the conventional flash memory cell. Alternatively, the memory cells can be formed from thin-film polysilicon layer within the current CMOS process environment. Furthermore, the memory cells can be formed in between the routing layers. In this manner, fabricating the memory cells is independent of fabricating the peripheral circuits on the surface of the wafer. In order to form the memory cells in between the metal routing layers, LTPS (Low Temperature Polycrystalline Silicon) can be used, as published, U.S. Pat. No. 5,395,804, U.S. Pat. No. 6,852,577 and U.S. Pat. No. 6,951,793. The LTPS has been developed for the low temperature process (around 500 centigrade) on the glass in order to apply the display panel. Now the LTPS can be also used as a thin film polysilicon transistor for the memory device. The thin film based transistor can drive multi-divided bit line which is lightly loaded, even though thin film polysilicon transistor can flow less current than single crystal silicon based transistor on the surface of the wafer, for example, around 10 times weaker than that of conventional transistor, as published, "Poly-Si Thin-Film Transistors: An Efficient and Low-Cost Option for Digital Operation", IEEE Transactions on Electron Devices, Vol. 54, No. 11, November, 2007, and "A Novel Blocking Technology for Improving the Short-Channel Effects in Polycrystalline Silicon TFT Devices", IEEE Transactions on Electron Devices, Vol. 54, No. 12, December, 2007. During LTPS process, the MOS transistor in the control circuit and routing metal are not degraded. And the steps in the process flow should be compatible with the current CMOS manufacturing environment as published, such as U.S. Pat. No. 7,283,393, and No. 7,183,174, and No. 7,157,332, and No. 7,141,474 to form the NAND flash memory cell. And forming the thin film transistor is similar to forming TFT (thin film transistor) SRAM, as published, U.S. Pat. No. 6,670,642. In this respect, detailed manufacturing processes for forming the memory cell, such as width, length, thickness, temperature, forming method, or any other material related data, are not described in the present invention.

In FIG. 10A to 10C, example layout for the local sense amp is illustrated, wherein the local sense amp 1020 (720 in FIG. 7) includes six transistors. The local sense amp 1020 includes NMOS transistor 1026 as a left write transistor, transistor 1025 as a left read transistor, transistor 1026' as a right write transistor, transistor 1025' as a right read transistor, PMOS transistor 1022 as a local pre-charge transistor, and transistor 1023 as a local amplify transistor which is powered by the VDA voltage for sensing, wherein p+ region of the PMOS transistors are formed on deep n-well (DNW), and n+ region of the NMOS transistors are formed on a separate p-well (PW) which is enclosed by the deep n-well (DNW), where the DNW is forced to the VDA voltage or higher voltage (not shown). And metal-1 region and via-1 region are defined as shown in FIG. 10B, such that metal-1 region 1021 is connected to the left write transistor 1026 and the left read transistor 1025, where metal-1 region 1021 serves as the left local bit line and metal-1 region 1041 serves as the global bit line. In FIG. 10C, metal-2 region is defined, such that metal-2 region is used to connect the global bit line 1041, and the amplify node 1023A is shared by the left read transistor 1025 and the right read transistor 1025'.

In FIG. 10D, a schematic for the local sense amp 1020 is illustrated for ease of understanding the layout. The memory cell is connected to the local sense amp 1020 through the left local bit line 1021. And the local sense amp 1020 includes the left write transistor 1026, the left read transistor 1025, the right write transistor 1026', the right read transistor 1025', the local pre-charge transistor 1022, and the local amplify transistor 1023, wherein the local pre-charge transistor 1022 and the local amplify transistor 1023 are supplied by the VDA voltage.

Figure 11A:
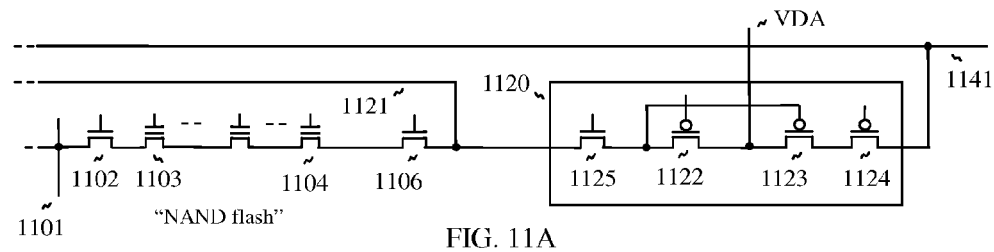
FIG. 11A illustrates a related circuit schematic for explaining a cross sectional view of a planar memory cell.

Referring now to FIG. 11A, a related circuit schematic to explain a cross sectional view for the memory cell array (NAND string) and the local sense amp 1120, wherein the memory cells 1103 and 1104 are serially connected, the select transistor 1102 is connected to the source line 1101, and the other select transistor 1106 is connected to the local bit line 1121. The local sense amp 1120 comprises the local read transistor 1125 connecting to the local sense amp 1121, the local pre-charge transistor 1122, the local amplify transistor 1123 (which is powered by the VDA voltage) and the local select transistor 1124 which is connected to the global bit line 1141, where the write transistor is not shown.

Figure 11B:
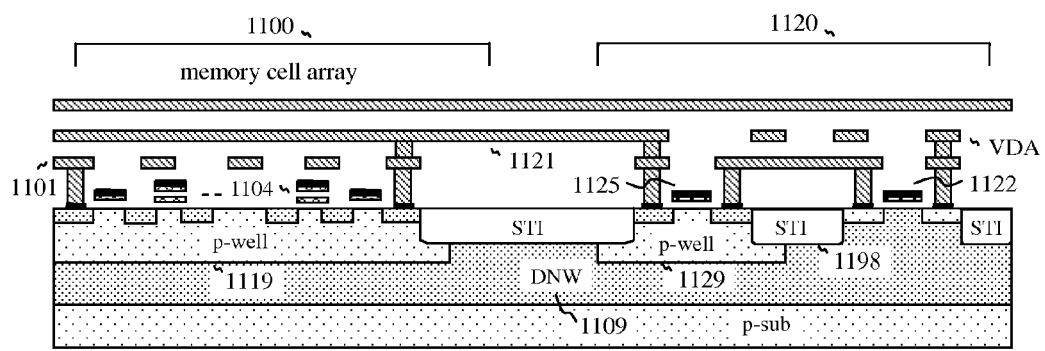
FIG. 11B illustrates a cross sectional view for the memory cell array, according to the teachings of the present invention.

Referring now to FIG. 11B in view of FIG. 11A, a cross sectional view for the memory cell array (NAND string) 1100 and the local sense amp 1120 is illustrated as an example implementation, wherein the memory cells are formed on the p-well 1119, the NMOS local read transistor 1125 of the local sense amp 1120 is formed on the separate p-well 1129, and the PMOS local pre-charge transistor 1122 is formed on the deep n-well (DNW) region 1109 which is formed on the p-substrate 1199. In the NAND string 1100, memory cell 1104 is placed in the middle region of the select transistors. The local sense amp is connected to the NAND string through the local bit line 1121. The transistors are isolated by STI (Shallow Trench Isolation) region 1198.

Figure 12:
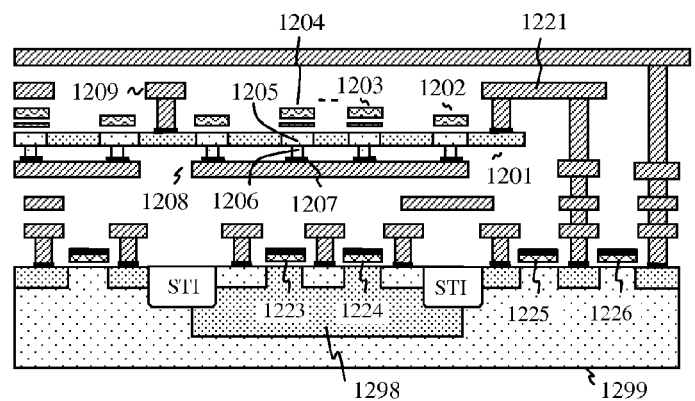
FIG. 12 illustrates a cross sectional view for a stacked memory cell on peripheral circuit, according to the teachings of the present invention.

In FIG. 12, an example cross sectional view including the memory cell which is stacked over a peripheral circuit, wherein the memory cell is formed from polysilicon layer, such as LTPS (Low Temperature Polycrystalline Silicon) layer, so that the memory cells 1203 and 1204 are formed over metal bias line 1208 which provides a body bias voltage, and the source line 1209 is connected to the NAND string. Alternatively, the memory cell can be formed from various semiconductor materials, such as silicon-germanium and germanium. The charge trap region is formed in between the poly gate 1204 and body region 1205. The body region 1205 is connected to the metal line 1208 through poly plug 1206 and ohmic contact region 1207. The local write transistor 1226 is connected to the local bit line 1221, and the local read transistor 1225 is connected to the local bit line 1221 as well. And more memory cells can be serially connected even though the drawing illustrates two memory cells only for simplifying the drawing. In the peripheral circuit region (first floor), the local sense amp is composed of the (PMOS) local amplify transistor 1223 and the local select transistor 1224, and which transistors are formed on the n-well region 1298. And other NMOS transistors are formed on the substrate 1299.

Figure 13:
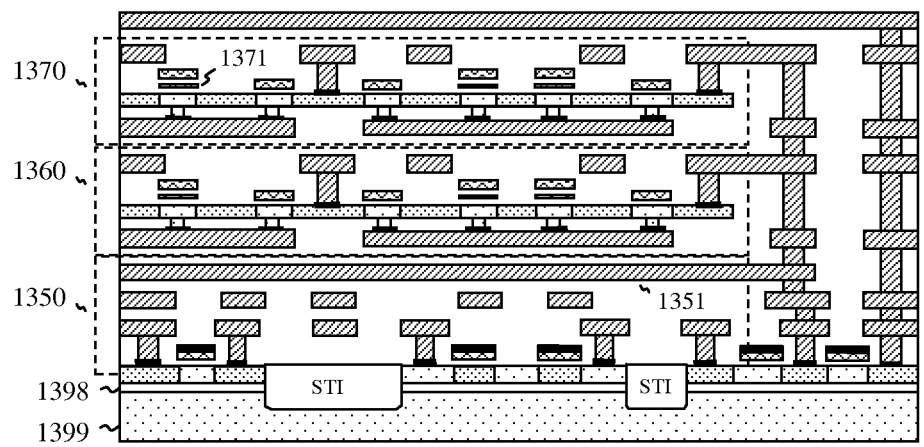
FIG. 13 illustrates a cross sectional view for multi-stacked memory cells on peripheral circuit, according to the teachings of the present invention.

In FIG. 13, a cross sectional view for the multi-stacked memory cell is illustrated, wherein the memory string in the third floor 1370 is formed on the second floor 1360, and the memory string in the second floor 1360 is formed on the control circuit 1350 which is formed on the surface of the wafer. The memory strings are connected to the local bit line 1351 through multiple layers which are also used for routing layers in the peripheral circuits (not shown). In particular, the local bit line 1351 is relatively shorter than that of planar type memory cells, in order to compensate low current driving capability of the TFT (thin film transistor) based floating gate memory cell 1371, such that the local bit line is 10 to 20 times shorter. In consequence, the access time is similar to planar type memory with shorter local bit line, and more local sense amps are repeated to read the memory cell but area penalty is negligible because the local sense amps are formed under the memory cells. The control circuit 1350 is formed from single crystal silicon layer on the buried oxide layer 1398 of the SOI (Silicon on Insulator) wafer 1399 alternatively.

Figure 14:
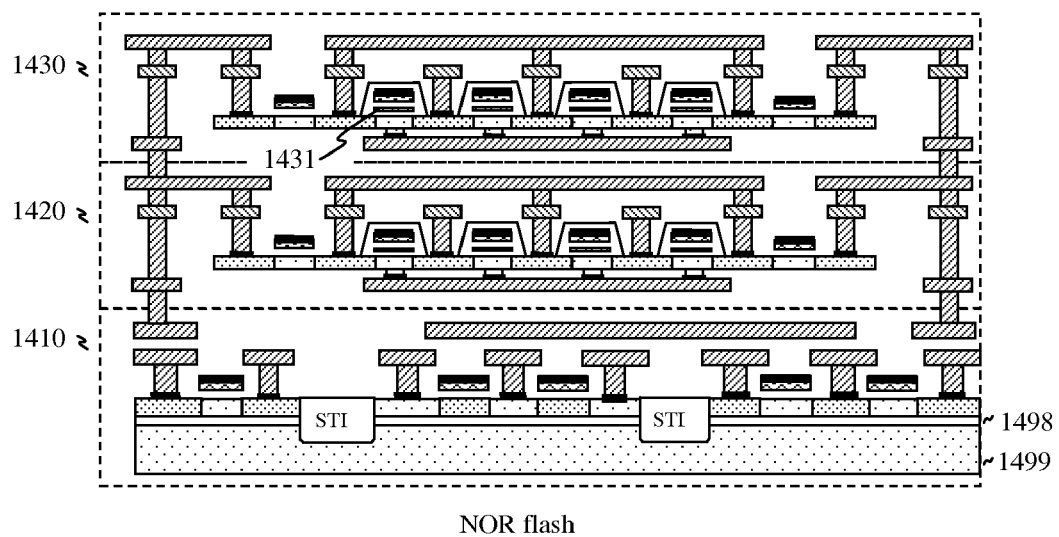
FIG. 14 illustrates a cross sectional view for fabricating a NOR flash memory, according to the teachings of the present invention.

In FIG. 14, a cross sectional view for configuring a NOR flash memory (shown FIG. 9B) is illustrated, wherein the NOR string 1430 is formed on another NOR string 1420 which is formed on the peripheral circuit, where the peripheral circuit is formed on the surface of the wafer. And the peripheral circuit can be formed from single crystal silicon layer on the buried oxide layer 1498 of the SOI (Silicon on Insulator) wafer 1499. And other layers are the same as FIG. 13.

Furthermore, the charge trap region 1431 of the floating gate memory cell and the TFT floating gate memory cell can be formed from various materials, such as polysilicon layer to form a flash memory, nitride layer to form an MNOS (metal-nitride-oxide semiconductor) memory or a SONOS (silicon-oxide-nitride-oxide semiconductor) memory, alumina to form a MAOS (metal-alumina-oxide-semiconductor) or a MAS (metal-alumina-semiconductor), and nanocrystal layer to form a nanocrystal memory as published, U.S. Pat. No. 6,690,059. In particular, quantum dot can be used to form a single electron memory, such that one or two charge trap regions can be used to store charge as published, U.S. Pat. No. 5,960,266 and No. 7,105,874.

While the description here has been given for configuring the memory circuit and structure, alternative embodiments would work equally well with reverse connection, such that p-channel NAND flash memory can be used, as published in U.S. Pat. Nos. 5,581,504 and 7,061,805. Thus, the memory cell configuration is also reversed, wherein the floating gate storage device includes p-type source and drain with n-type body. And also, the control signal polarities are reversed in order to control the reversely configured memory cell.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A memory device, comprising:
   a memory cell which includes a floating gate MOS transistor having a charge trap region;
   a memory cell array, wherein a plurality of memory cells is serially connected to configure NAND flash memory, one side of the memory cell array is connected to a first select transistor, and the other side of the memory cell array is connected to a second select transistor, where the first select transistor is connected to a local bit line; and
   a local sense amp including a local dynamic read circuit and a local write circuit, wherein the local dynamic read circuit includes a local read transistor for connecting the local bit line to a local amp node, a local pre-charge transistor for pre-charging the local amp node, and a local amplify transistor which reads a discharge time of the local amp node whether charging a global bit line or not; the local write circuit includes a local write transistor for connecting the local bit line to the global bit line; and
   a global sense amp including a global dynamic read circuit, a global latch circuit, and a global write circuit, wherein the global dynamic read circuit includes a global reset transistor for resetting the global bit line, a global amplify transistor for reading the global bit line, and a global select transistor for configuring a global series connection with the global amplify transistor; a global latch circuit is connected to the global series connection for receiving a read data; the global write circuit includes a global write transistor for transferring a write data to the global bit line; and
   a read path which is set up for reading a stored data from the memory cell and transferring to the global latch circuit through the local bit line, the local dynamic read circuit, the global bit line and the global dynamic read circuit; and
   a write path which is set up for writing the write data from the global latch circuit to the memory cell through the local bit line, the local write circuit, the global bit line and the global write circuit; and
   a locking signal generator for realizing time-domain sensing scheme, wherein the locking signal generator generates a delayed signal as a locking signal for locking the global dynamic read circuit, and the locking signal generator receives a latched signal from the global latch circuit as a reference signal based on at least a reference memory cell.

2. The memory device of claim 1, wherein the local sense amp includes the local dynamic read circuit and the local write circuit, such that the local dynamic read circuit includes the local read transistor for connecting the local bit line to a local amp node, the local pre-charge transistor for pre-charging the local amp node, and the local amplify transistor which reads the charge time of the local amp node whether discharging the global bit line or not; the local write circuit includes the local write transistor for connecting the local bit line to the global bit line.

3. The memory device of claim 1, wherein the local sense amp includes the local dynamic read circuit and the local write circuit, such that the local dynamic read circuit includes the local read transistor connecting the local bit line to a local amp node, the local pre-charge transistor for pre-charging the local amp node, and the local amplify transistor configuring a local series connection with a local select transistor, wherein the local amplify transistor reads a discharge time of the local amp node whether charging a global bit line or not through the local series connection; the local write circuit includes a local write transistor for connecting the local bit line to the global bit line.

4. The memory device of claim 1, wherein the local sense amp includes the local dynamic read circuit and the local write circuit, such that the local dynamic read circuit includes the local read transistor for connecting the local bit line to a local amp node, the local pre-charge transistor for pre-charging the local amp node, and the local amplify transistor configuring a local series connection with a local select transistor, wherein the local amplify transistor reads a charge time of the local amp node whether discharging a global bit line or not through the local series connection; the local write circuit includes a local write transistor for connecting the local bit line to the global bit line.

5. The memory device of claim 1, wherein the global sense amp is composed of the global dynamic read circuit, the global latch circuit, and the global write circuit, such that the global dynamic read circuit includes the global reset transistor for resetting the global bit line, the global amplify transistor for reading the global bit line, and the global select transistor for configuring the global series connection with the global amplify transistor; the global latch circuit is connected to the global series connection for receiving the read data and a data transfer circuit for receiving the write data from a data bus; the global write circuit includes the global write transistor which is connected to the global latch circuit for transferring the write data to the global bit line.

6. The memory device of claim 1, wherein the locking signal generator generates a delayed signal as a locking signal for locking the read circuit, and delay time of the delay circuit is set by fuse circuits.

7. The memory device of claim 1, wherein the floating gate MOS transistor of the memory cell stores multi-level data in a charge trap region.

8. The memory device of claim 1, wherein the floating gate MOS transistor of the memory cell is formed from various materials, such as single crystal silicon, polysilicon, silicon-germanium and germanium.

9. The memory device of claim 1, wherein the charge trap region of the memory cell includes nitride layer to form an MNOS (metal-nitride-oxide semiconductor) memory and a SONOS (silicon-oxide-nitride-oxide semiconductor) memory.

10. The memory device of claim 1, wherein the charge trap region of the memory cell includes alumina layer to form MAOS (metal-alumina-oxide-semiconductor) and MAS (metal-alumina-semiconductor).

11. The memory device of claim 1, wherein the charge trap region of the memory cell includes nanocrystal layer to form nanocrystal memory, and quantum dot to form a single electron memory.

12. The memory device of claim 1, wherein the floating gate MOS transistor of the memory cell includes n-channel MOS field effect transistor or p-channel MOS field effect transistor.

13. The memory device of claim 1, wherein the floating gate MOS transistor of the memory cell is formed from thin film transistor which is composed of a gate region, a charge trap region, a drain region, a source region and a body region, where the body region is biased a bias voltage.

14. The memory device of claim 1, wherein the floating gate MOS transistor of the memory cell is formed on peripheral circuits.

15. The memory device of claim 1, wherein the floating gate MOS transistor of the memory cell is stacked over another floating gate MOS transistor.

16. The memory device of claim 1, wherein the memory string includes a memory cell array configuring a NOR flash memory such that a plurality of the memory cells is connected to the local bit line.

* * * * *